United States Patent [19]

Mallon

[11] Patent Number: 5,628,869

[45] Date of Patent: May 13, 1997

[54] PLASMA ENHANCED CHEMICAL VAPOR REACTOR WITH SHAPED ELECTRODES

[75] Inventor: Thomas G. Mallon, Santa Clara, Calif.

[73] Assignee: LSI Logic Corporation, Milpitas, Calif.

[21] Appl. No.: 239,987

[22] Filed: May 9, 1994

[51] Int. Cl.⁶ ................................................. C23F 1/02
[52] U.S. Cl. ........................... 438/694; 156/345; 216/71; 118/723 E; 427/569; 438/729; 438/763; 438/778; 438/697
[58] Field of Search ................. 156/345 P, 643.1; 217/71; 118/723 E; 427/569

[56] References Cited

U.S. PATENT DOCUMENTS

| | | | |
|---|---|---|---|
| 4,297,162 | 10/1981 | Mundt et al. | 156/643 |
| 4,342,901 | 8/1982 | Zajac | 219/121 PD |
| 4,827,870 | 5/1989 | Lee | 118/665 |
| 5,009,920 | 4/1991 | Lee | 427/9 |
| 5,036,630 | 8/1991 | Kaanta et al. | 451/289 |
| 5,439,524 | 8/1995 | Cain et al. | 118/723 E |
| 5,441,442 | 8/1995 | Haisma et al. | 451/288 |

OTHER PUBLICATIONS

Eisele, K.M. "Electrode separation and convex electrode surfaces in plasma etching" J. Vac. Sci. Tech. A vol.5, No.4, pt.3, pp. 1926–1927 Jul. 1987.

*Primary Examiner*—R. Bruce Breneman
*Assistant Examiner*—Anita Alanko
*Attorney, Agent, or Firm*—Oppenheimer Poms Smith

[57] ABSTRACT

A semiconductor integrated circuit is made by a process including the formation on a surface of a semiconductor integrated circuit processing wafer of a layer of material applied to the wafer by plasma enhanced chemical vapor deposition (PECVD). The layer of material may include plural sub-layers; the thicknesses of which are additive to result in the thickness of the layer of material itself. The sub-layers of material may have non-uniform thicknesses across a dimension of the processing wafer because of compromises in the process which are necessary to control various parameters of the material layer other than its thickness. These non-uniformities of thickness of the sub-layers may be controlled to offset one another so that the resulting layer of material has a substantially uniform thickness across the dimension of the processing wafer. A method, and apparatus for practicing the method, are set forth along with an explanation of how particular geometric factors of electrodes used in the PECVD process affect the resulting thickness non-uniformities. The thickness non-uniformities of the sub-layers may also be largely abated by use of the invention in a predictive-corrective fashion. A similar predictive-corrective method and resulting apparatus is set forth for gas plasma etching of an existing layer of material on a semiconductor integrated circuit processing wafer.

5 Claims, 3 Drawing Sheets

PLASMA ENHANCED CHEMICAL VAPOR REACTOR WITH SHAPED ELECTRODES

BACKGROUND OF THE INVENTION

1. Field of the Invention

The present invention is in the field of chemical vapor reactors. More particularly, the present invention is in the field of plasma enhanced chemical vapor deposition and plasma etching.

2. Related Technology

A conventional and exemplary plasma enhanced chemical vapor deposition (PECVD) apparatus and method is shown in accord with U.S. Pat. No. 4,827,870, issued 9 May 1989, to James C. Lee. According to the teaching of Lee, a precision multilayer optical interference coating is deposited on an optical substrate having a complex topology. In order to achieve the deposition of precision multi-layer coatings, the Lee patent discloses the use of a feed electrode which is complimentary in shape to a cavity formed in a passive or ground electrode. The ground electrode is in turn shaped to hold and generally to match the shape of the substrate. For example, a substrate may have the shape of a visor for an aviator's helmet. Accordingly, the ground electrode would form a cavity formed to accommodate the shape of the visor, and the feed electrode would be shaped to be complementary to the shape of the substrate topology, and generally complementary to the cavity shape of the ground electrode.

Another conventional form of plasma enhanced chemical vapor deposition apparatus and method is shown in U.S. Pat. No. 5,009,920, issued 23 Apr. 1991, also to James C. Lee. This latter patent to Mr. Lee addresses the plasma enhanced chemical vapor deposition of precise multi-layer coatings to optical and other substrates, such as mirrors for ring laser gyroscopes. Similarly to the '870 patent discussed above, the '920 patent discloses the use of a passive or ground-potential electrode and an active or feed electrode having shapes which are generally complimentary to one another. The active and passive electrodes also accommodate and compliment the topology of a substrate placed into a gap defined between the electrodes.

Neither of these conventional PECVD apparatus, however, are believed to address problems of non-uniformity in the thickness of deposited coatings across their dimensions of length and width, as typically results from such conventional plasma enhanced chemical vapor deposition processes. In the fabrication of integrated circuits on processing wafers of semiconductor material, such as silicon, plasma enhanced chemical vapor deposition is frequently used to apply successive layers of material on the substrate of the processing wafers. The processing wafers of substrate material are typically about three inches, about six inches, or about eight inches in diameter, for example, and have planar opposite faces.

In a batch type of wafer processing method, the processing wafers move from one work station to the next within a single reaction chamber having plural work stations. At each work station, a portion of the total thickness of a particular material to be deposited using the plasma enhanced chemical vapor deposition process is applied. That is, each work station in the batch processing reaction chamber applies a respective sub-layer of material, and the successive sub-layers aggregate to form a single material layer in the morphology of the integrated circuit. Alternatively, a plurality of separate plasma enhanced chemical vapor deposition reaction chambers, known as "cluster tools", may be used individually to build up the sub-layers of material necessary for a particular layer of the integrated circuit morphology. In this case, the processing wafers move from one reaction chamber to the next to have the successive sub-layers applied.

However, regardless of whether the successive sub-layers of material are applied to semiconductor integrated circuit processing wafers using a single batch-processing reaction chamber, or by using cluster tools to apply the successive sub-layers, it has been found that the PECVD process sometimes results in a non-uniformity in the thickness of successive sub-layers across the dimensions of a wafer. Generally this non-uniform thickness appears across a diameter of the round processing wafers, and is referred to as a "bull's eye" effect. That is, the individual sub-layers are typically thicker in the center of the processing wafer, and thinner at the wafer perimeter, or vice versa.

The non-uniformity of deposited sub-layer thickness sometimes encountered in PECVD processing of semiconductor wafers is believed to be related to a variety of processing parameters including the particulars of the material being deposited, the temperature and pressure of processing, the gas flow direction at particular locations in the gap between the active electrode and the substrate, and the concentration of active feed gas in the gap at particular locations of the plasma. However, non-uniformities in sub-layer thickness non-uniformities conventionally can not be brought down to less than a certain level because of the need to control other aspects of the material deposition process. Although some of the sub-layers may have opposite or compensating non-uniformities in their thicknesses, if several of the sub-layers in a particular material layer are non-uniform in their thickness in the same way, and insufficient compensating non-uniformities are present in the other sub-layers on the processing wafer, then the processing wafer with the finished material layer will have a problematic thickening at its center or at its edges. Such a thickening at the center or edges of a semiconductor integrated circuit processing wafer may be detrimental to subsequent processes in the fabrication of the integrated circuits on the wafer, and is an uncontrolled variable in the manufacturing process.

Alternatively, plasma reaction chambers may also be used to effect etching of a particular area of a material layer on an integrated circuit processing wafer. This etching operation is known in the art of manufacturing integrated circuits. Generally, a gas such as a mixture of Freons, and possibly including Argon ($CHF_2$, $CF_4$, and possibly with added Argon) is employed, which in the plasma reaction produces radicals $CF_2$, and $CF_3$. These radicals etch an oxide surface layer on the integrated circuit processing wafer. In this instance also, a bull's eye effect is experienced. That is, the rate of material removal by etching is non-uniform across the diameter of a processing wafer, so that the thickness of the material layer remaining after the etching operation is non-uniform across its diameter even if it was uniform before the etching operation.

It can be seen in view of the above, that a great variability exists in the manufacture of integrated circuits using plasma reactors. The material layers deposited with such reactors in a PECVD process may be non-uniform across a dimension of the wafers, and the non-uniformity may be such that the material layer is center-thick, or center-thin (convex or concave). Also, the etching process carried out in plasma reactors may have a non-uniformity of material etching so that the remaining layer of material after the etching operation is similarly non-uniform across a dimension of the processing wafer. This post-etching material layer may also be center-thick or center-thin (convex or concave).

Because of the many steps of material deposition, masking, and etching which are necessary to build up the morphology of current complex integrated circuits, the variations of material thickness across a dimension of an integrated circuit processing wafer can cause great difficulties in the manufacturing environment, and reduced yields from this manufacturing. These non-uniformities of material thickness typically result from the non-uniformity effects in both PECVD and plasma reaction etching. As mentioned, current integrated circuit processing wafers have grown in diameter from the historical three inch size to current six inch and eight inch wafers. Additionally, even larger integrated circuit processing wafers of up to twelve inches, or larger, in diameter are being considered for use in manufacturing integrated circuits. Consequently, the problems associated with thickness non-uniformities of deposited and etched material layers are expected to be more troublesome as the size of the processing wafers increases.

SUMMARY OF THE INVENTION

In view of the above, a primary object for this invention is to provide a semiconductor integrated circuit processing wafer having a PECVD material layer of improved thickness uniformity.

Another object is to provide a semiconductor integrated circuit processing wafer having a layer of material which is etched by plasma reaction etching, and which has an improved uniformity of thickness across a dimension of the wafer;

Still another object of the present invention is to provide such a semiconductor integrated circuit processing wafer having a PECVD material layer including plural sub-layers, which sub-layers have compensating thickness non-uniform thickness so as to result in a composite material layer having a generally uniform thickness.

Another object for this invention is to provide a method of making such a semiconductor integrated circuit processing wafer.

Accordingly, the present invention provides a semiconductor integrated circuit processing wafer having a PECVD material layer including at least two additive sub-layers of non-uniform and compensating thickness, whereby the composite PECVD material layer has a generally uniform thickness across said processing wafer.

The present invention also provides a plasma reaction method of making a semiconductor integrated circuit processing wafer with a deposited PECVD material layer or etched material layer; said method including the steps of providing a semiconductor integrated circuit processing wafer with a material layer which is to be etched or a surface upon which the PECVD material layer is to be deposited, placing the processing wafer upon a planar passive electrode, juxtaposing a feed electrode with the passive electrode to define a gap in which the processing wafer is disposed, and configuring an active surface of the feed electrode to define a profile selectively complementary to or like an anticipated etching or deposition profile of non-uniformity, and using the configured electrode to etch the material layer more uniformly, or to apply the PECVD material layer with a more overall uniform thickness.

Additional objects and advantages of the present invention will appear from a reading of the following detailed description of a single exemplary preferred embodiment of a processing wafer embodying the invention, and of processing method steps therefore, taken in conjunction with the appended drawing Figures, in which the same reference numeral designates the same feature or features which are analogous in structure or function.

DETAILED DESCRIPTION OF A PREFERRED EXEMPLARY EMBODIMENT OF THE INVENTION

Figure 1:
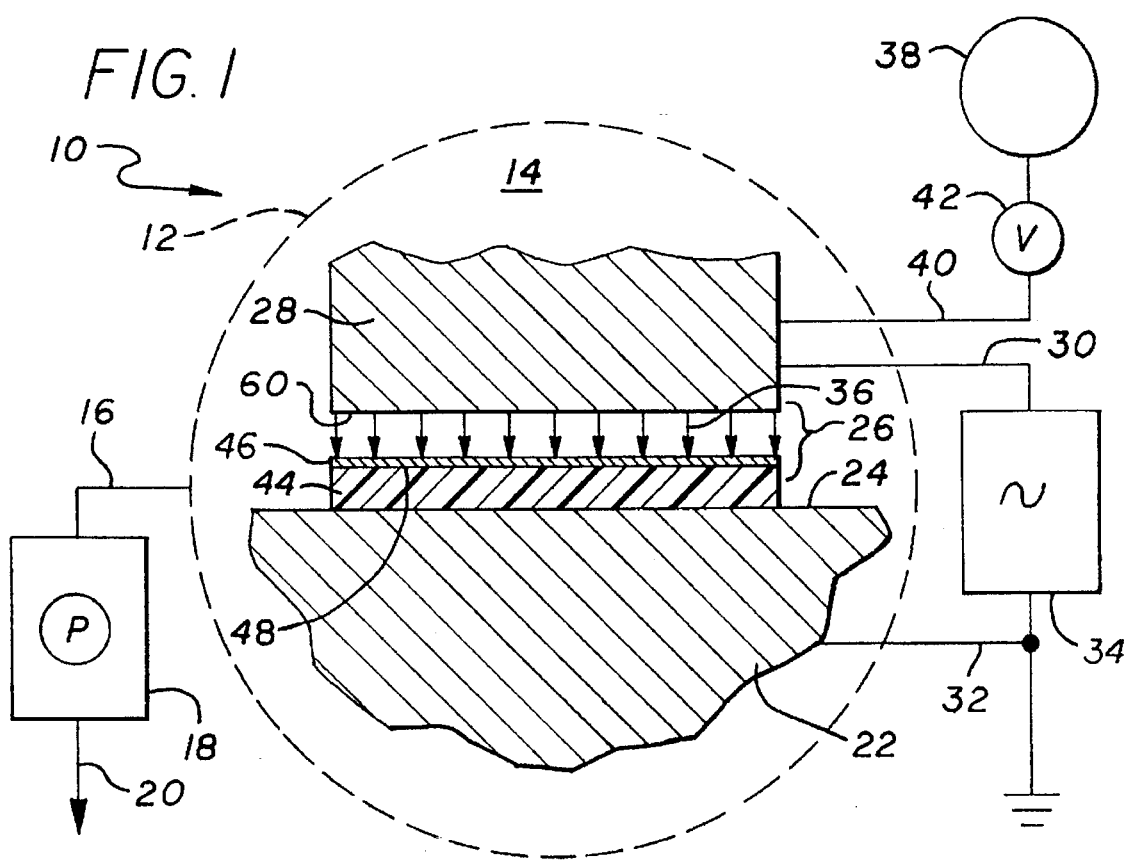
FIG. 1 schematically and partially in cross section depicts a plasma reaction chamber in which either plasma enhanced chemical vapor deposition or plasma etching of a material layer is conducted, with a semiconductor integrated circuit processing wafer disposed therein preparatory to such deposition or etching of a material layer.

Viewing FIG. 1, a plasma reaction chamber apparatus 10 is schematically depicted. The plasma reaction chamber apparatus 10 may be used either as a plasma enhanced chemical vapor deposition reaction chamber, or as a plasma reaction etching apparatus, as is known in the pertinent arts. The reaction chamber apparatus 10 includes an enclosure structure 12 (depicted with dashed lines) for defining a vacuum chamber 14. In order to evacuate the chamber 14, a conduit 16 opens to the chamber 14 and connects to a vacuum pump 18. As indicated by the arrow 20, the vacuum pump 18 may be selectively used to evacuate the chamber 14 after the latter has been open to ambient atmosphere, and also during use of the chamber 14 in order to maintain a selected vacuum level despite the admission of gasses to this chamber.

Within the chamber 14 a passive or ground-potential electrode member 22 is disposed which defines a planar upper surface 24. Juxtaposed above the electrode 22, and cooperating therewith to define a gap 26, is an active or feed electrode 28. In order to apply an electromagnetic field of radio frequency or microwave frequency, for example, between the electrodes 22 and 28, a pair of leads 30, 32 respectively extend outwardly from the electrodes 22, 28, of the vacuum chamber 14 to a power supply 34. The feed electrode 28 is porous or perforate in order to supply a feed gas into the gap 26, as is indicated by the arrows 36. This feed gas is provided from a feed gas source, depicted schematically as a storage and supply tank 38. A conduit 40 with interposed control valve 42 extends from the tank 38 into the chamber 14 and to the feed electrode 28.

As those who are ordinarily skilled in the pertinent arts are aware, a semiconductor integrated circuit processing wafer, indicated with the numeral 44 is placed upon the passive electrode 22 in the gap 26. The apparatus 10 will ordinarily include handling and orientation devices (not shown) which are effective to insert the wafer 44 into the gap 26, and to remove this wafer after processing between the electrodes 22, 28, for example. The handling and orientation apparatus may be used for movement of the wafer 44 within or outside of chamber 14 to another electrode pair for further processing.

The gas fed into the gap 26 for plasma enhanced chemical vapor deposition (recalling arrows 36) is generally a metallic-organic compound, or another such compound, which will react to form a plasma under the influence of the electromagnetic field applied between the electrodes 22 and 28. The plasma reaction results in a layer 46 of material from the plasma reaction of the gas 36 in the gap 26 being deposited on the surface 48 of the wafer 44. For example, the gas $SiH_4$ along with $N_2O$, may be used to deposit a layer of $SiO_2$ on the substrate wafer 44.

Alternatively, as is known in the semiconductor processing art, the plasma reaction chamber apparatus 10, may be used to effect a plasma etching of a material layer already present on the processing wafer 44. In this latter case, for example, the gasses $CHF_3$, and $CF_4$, (both Freons), possibly along with added Argon, may be used to effect an etching of an oxide layer on the wafer 44. These gasses will form radicals $CF_2$, and $CF_3$, which are effective to etch a layer of oxide material on the wafer 44. Ordinarily, a mask will be used to shield part of the material layer from the action of the plasma etching so that a particular pattern of the material remains after the etching operation. In this way, a selected morphology is built up for the integrated circuit formed on the processing wafer 44.

Figure 2:
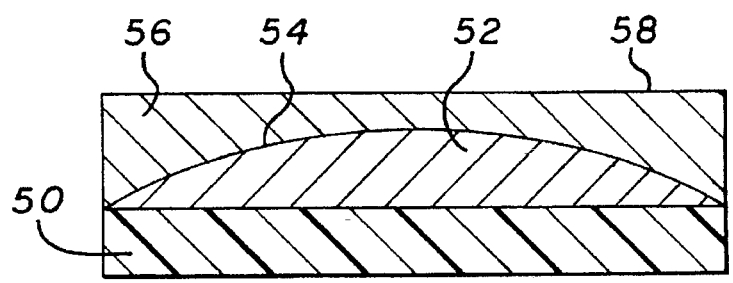
FIG. 2 provides a schematic cross sectional illustration of a semiconductor integrated circuit processing wafer upon which are disposed in accordance with the present invention two material layers, which layers are each somewhat non-uniform in thickness but which are offset in their thickness non-uniformity.

FIG. 2 shows a semiconductor integrated circuit processing wafer 50 upon which a first layer 52 of material has been deposited by PECVD. The layer 52 is thicker in the center of the wafer 50 than it is near the periphery of this wafer. That is, the layer 52 defines a convex upper surface 54. However, wafer 50 also has received a second layer 56 of material which is thicker near the periphery of the wafer than it is near the wafer center. Consequently, the two material layers 52 and 56 cooperate to result in the upper one (56) of these layers defining a surface 58 which is substantially parallel with the underlying surface of the wafer 50. That is, the two layers 52 and 56 of material are each non-uniform in their thickness, but have opposite senses of non-uniformity across a diameter of the wafer as seen in FIG. 2 so that the combination of layers 52 and 56 has a substantially uniform thickness on wafer 50.

Figure 3:
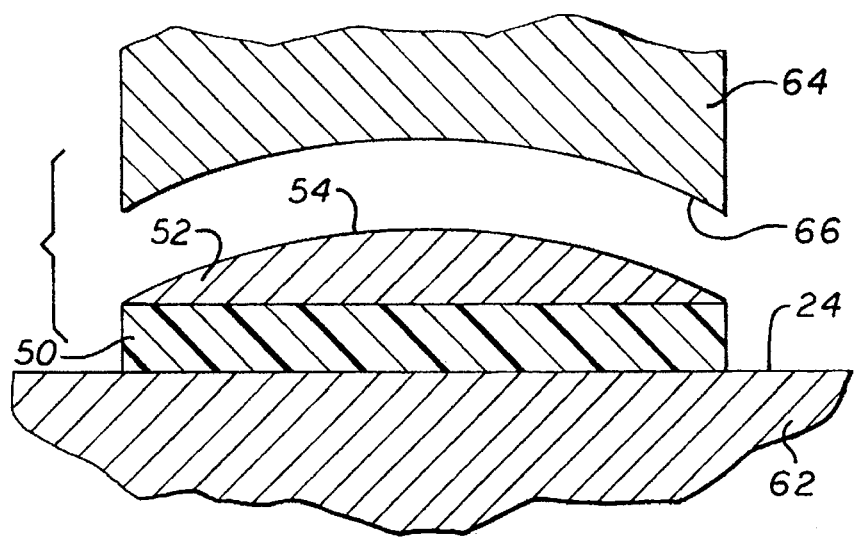
FIG. 3 schematically and partially in cross section depicts a step in the method of the present invention for making or etching a layer of material on a semiconductor integrated circuit processing wafer, which in the case of material layer deposition is intentionally made non-uniform in thickness in a sense which will fully or partially offset a prior non-uniformity of a material layer.

FIG. 3 depicts the wafer 50 at a preceding stage of manufacture after the layer 52 of material has been applied, and preparatory to application of the layer 56. If the PECVD process which applied layer 52 of material was conducted between a pair of electrodes configured as seen in FIG. 1, with the upper electrode 28 having a planar surface 60, and produced a layer 52 of material with a convex profile upper surface 54, then a similar convexity of material application may be anticipated for the layer 56. That is, a faster rate of material deposition is to be expected in the center of the wafer 50 than near the edges of this wafer. However, in order to compensate for this anticipated convexity of the layer 56, the wafer 50 is placed between a pair of electrodes 62, 64, the upper or feed electrode (64) of which defines a concave surface 66. It will be seen that the surface 66 of the electrode 64 is complementary to the anticipated profile of material thickness non-uniformity with respect to the layer 56 of material to be applied. Consequently, the conformation of electrode 64 results in a layer 56 of material being applied with a slower rate of material deposition near the center of the wafer and a faster peripheral rate of material deposition. The wafer 50 as seen in FIG. 2 results from the processing step seen in FIG. 3.

Figure 4:
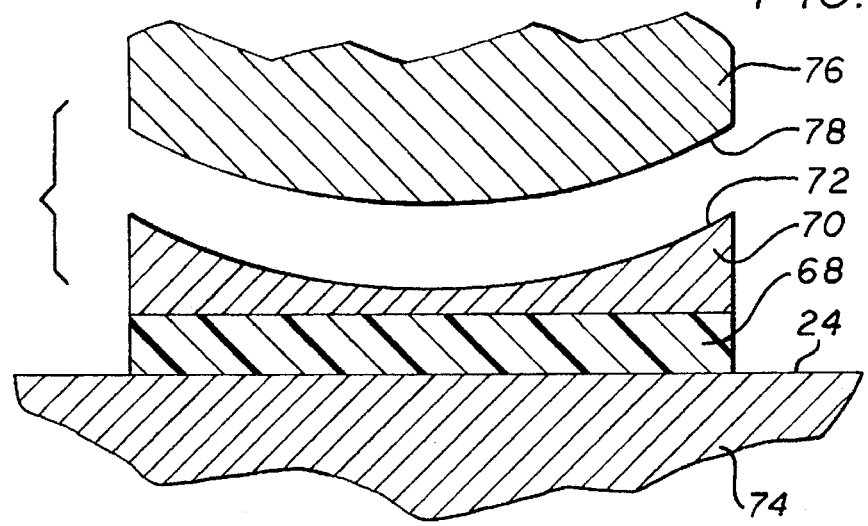
FIG. 4 schematically depicts a step in the method of making or etching a layer of material on a semiconductor integrated circuit processing wafer, which in the case of making a material layer is intentionally made non-uniform in thickness so as to fully or partially offset a prior non-uniformity of a material layer.

On the other hand, FIG. 4 depicts a processing step in which a wafer 68 has had a first layer 70 of material applied. The layer 70 of material defines a concave upper surface 72. If the layer 70 of material was applied between electrodes configured as seen in FIG. 1, and because of processing conditions and trade-offs necessary to control certain aspects and properties of the layer 70, resulted in a concave profile upper surface 72 for the layer, then a similar concavity of upper surface may be anticipated for a next subsequent application of material. However, in order to compensate for this anticipated concavity of material deposition, an electrode pair 74, 76 is employed, the upper or active feed (76) one of the electrodes defines a convex surface 78. Consequently, and again, a feed electrode having a contoured surface confronting the processing wafer, and which contoured surface is complementary to the anticipated profile of thickness non-uniformity of the material layer to be applied is used to compensate for this anticipated non-uniformity.

Figure 5:
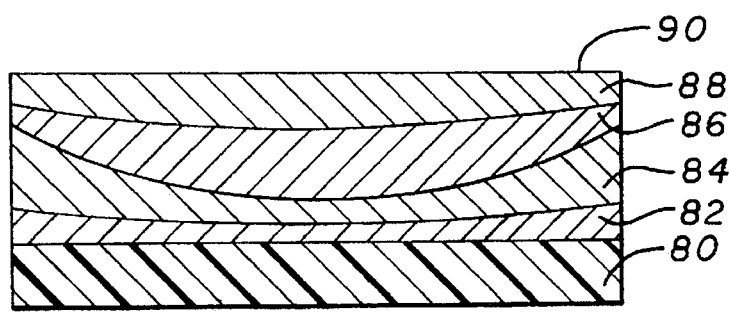
FIG. 5 schematically depicts a cross sectional view of a semiconductor integrated circuit processing wafer upon which plural material sub-layers are disposed, and which are offset with respect to one another.

FIG. 5 depicts a semiconductor integrated circuit processing wafer 80 upon which four (4) successive layers 82, 84, 86, and 88 of material have been deposited as described above. Understandably, if the material deposition steps producing each of these respective layers are anticipated from experience to produce layers of material with concave or convex material thickness profiles, then the feed electrodes used at each processing step may be complementary configured to the anticipated concavity or convexity of the material layer to reduce or eliminate this thickness non-uniformity.

This use of complementary-shaped active feed electrodes has been done in making the coated wafer 80 seen in FIG. 5. The layers 82–88 are more uniform in their thickness than could be achieved under identical processing conditions using the conventional technology of an active electrode not having a surface profile complementary to the anticipated profile of material thickness non-uniformity of material to be deposited with under process conditions and with the particular electrode. That is, the layers 82–88 have been produced predictively using active electrodes complementary to the anticipated profile of material thickness non-uniformity for the next layer of the deposited material. However, the layers 82 and 84 are still concave. That is, layers 82 and 84 are each thicker at their periphery than they are at their centers. In order to compensate for this additive concavity of the layers 82 and 84, the layers 86 and 88 are produced to be convex. That is, the layers 86 and 88 are produced using appropriately configured feed electrodes so that they are thicker at their centers than they are at their peripheries. The total thickness of the layers 82–88 is additive of the individual thicknesses of these layers, so that the layers 82–88 in combination provide an upper surface 90 on the layer 88 which is advantageously substantially parallel with the underlying surface of the wafer 80.

Underlying this concept of providing additive material layers with more uniform thickness non-uniformity profiles—profiles which are more uniform than are conventionally possible, and even with profiles of thickness non-uniformity which compensate for material thickness non-uniformities of other material layers on a processing wafer—is the understanding that the active surfaces of the feed electrodes in a plasma reaction apparatus may be predictively shaped to compensate for anticipated material layer profile non-uniformities. Further, the feed electrode can be shaped even more in a predictive sense to compensate for non-uniformities remaining from prior steps of the manufacturing process.

It will be noted in view of the above that the passive electrode 22, 62, 74 in each case defines a planar upper surface. In each case this planar upper surface is referenced with the numeral 24 to indicate that these electrode surfaces are analogous to one another. Necessarily, the upper surface of the passive electrode is planar in order to support and electrically contact the semiconductor material integrated circuit processing wafer. On the other hand, the active electrodes 64, and 76 include a surface 66, and 78, respectively, which is configured complementary to the anticipated non-uniformity of the material to be applied with that electrode.

Figure 6:
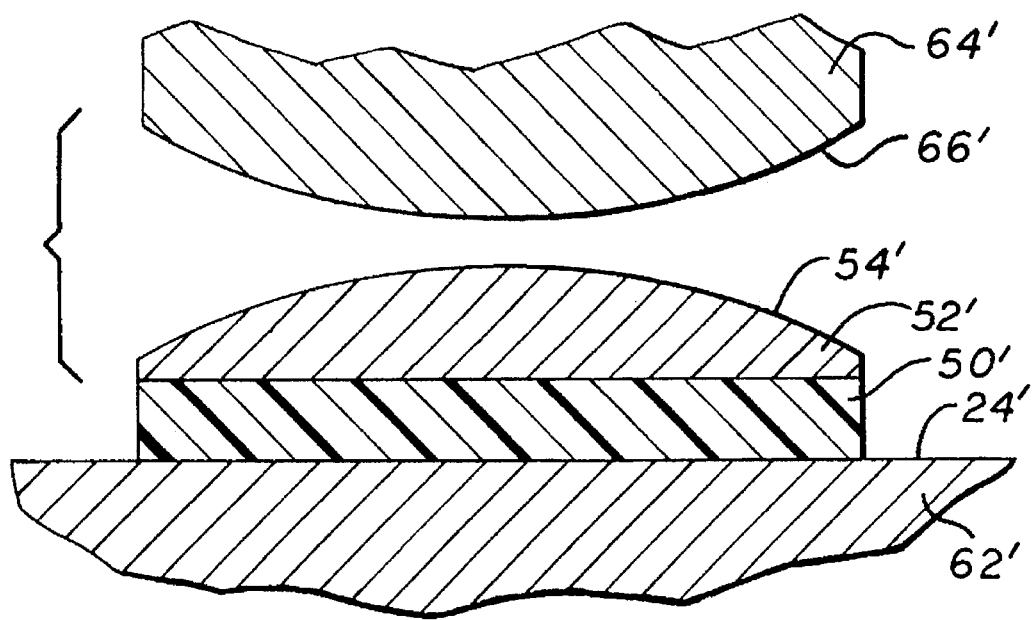
FIGS. 6 and 7 schematically depict respective steps in a method of making or etching a layer of material on a semiconductor integrated circuit processing wafer, in the case of making a material layer intentionally made non-uniform in thickness so as to fully or partially offset a prior non-uniformity of a material layer.
Figure 7:
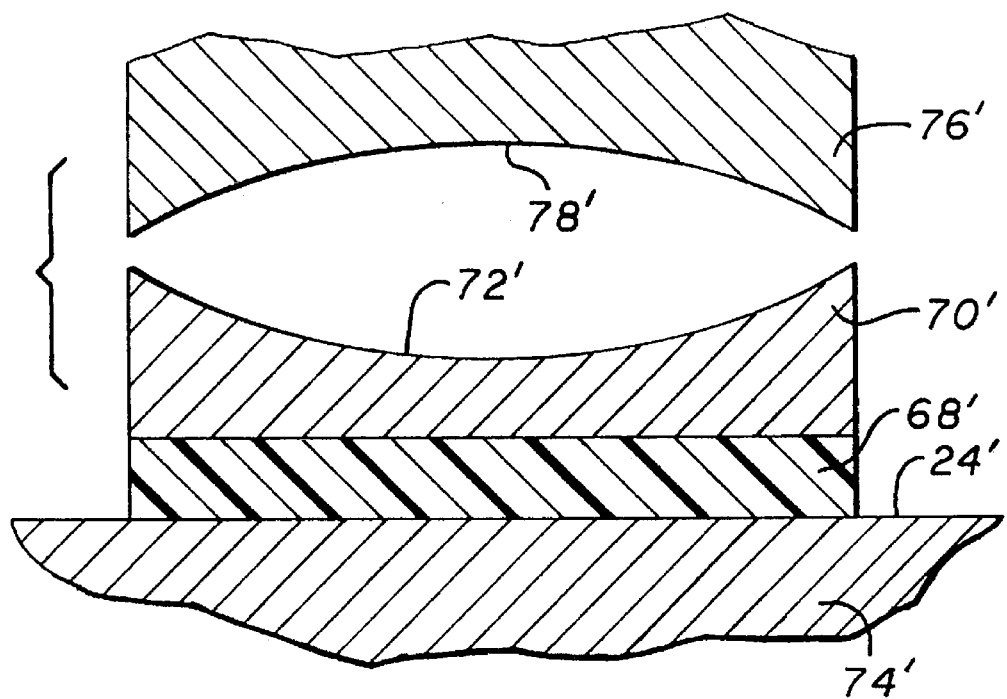

FIGS. 6 and 7 in conjunction illustrate a more rare case with PECVD in which the profile of the feed electrode is not complementary to the anticipated profile of material deposition, but is of like profile. In other words, with some processing conditions, a feed electrode with a convex profile will produce a layer of deposited material which is also convex (FIG. 6). The converse condition is illustrated in FIG. 7. In order to provide continuity of description with the drawing Figures discussed above, the features of FIGS. 6 and 7 are referenced with the same numerals used earlier with FIGS. 3 and 4, respectively, and having a prime added thereto. Viewing FIGS. 6 and 7, it is easily seen that a predictive-corrective process may be used to define the degree of concavity or convexity required for the surfaces 66' and 78' of the feed electrodes 64' and 76' in order to provide a desired profile for the resulting layer of material on the processing wafers 50', 68'.

Further to the above, similar concepts of predictive shaping of a feed electrode in a gas plasma reaction apparatus can be applied to the situation in which the plasma reaction chamber apparatus 10 is used to conduct a gas plasma etching operation. Referring to FIGS. 6, and 7, in conjunction, if these Figures are considered to depict a gas plasma etching operation, with the material profile resulting from a previous etching operation conducted with a planar feed electrode being represented by the profiles of the surfaces 54', and 72', respectively, then it is easily seen that FIGS. 6 and 7 represent a first stage of predictive and compensatory shaping of the feed electrodes 64' and 76'. In these cases, the feed electrodes are shaped to be like in profile to the anticipated profile of material resulting from the plasma gas etching operation. Since the prior operation produced convex and concave profiles, respectively, FIGS. 6 and 7 show that convex and concave feed electrodes 64' and 76' would be used to compensate toward graded profile uniformity of the layer of material after the etching operations to be carried out.

While the present invention has been depicted, described, and is defined by reference to particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

I claim:

1. A method of plasma processing a semiconductor integrated circuit processing wafer, comprising the steps of:

providing a semiconductor integrated circuit processing wafer with a surface carrying a layer of material to be plasma etched;

providing a passive electrode;

providing a feed electrode which defines with the passive electrode a gap;

disposing the processing wafer in the gap;

determining an anticipated material etching profile of non-uniformity of the layer of material to be plasma etched;

reconfiguring an active surface of the feed electrode to be non-complementary to the passive electrode and at the active surface to define a profile complementary to or like the anticipated material etching profile of non-uniformity; and using the reconfigured feed electrode, etching the material layer more uniformly.

2. A method of plasma processing a semiconductor integrated circuit processing wafer, comprising the steps of:

providing a semiconductor integrated circuit processing wafer with a surface carrying a layer of material to be plasma etched or to which a layer of material is to be applied by plasma enhanced chemical vapor deposition (PECVD);

providing a passive electrode;

providing a feed electrode which defines with the passive electrode a gap;

disposing the processing wafer in the gap;

determining an anticipated material deposition profile of non-uniformity of the layer of material to be applied by PECVD;

reconfiguring an active surface of the feed electrode to be non-complementary to the passive electrode and at the active surface to define a profile complementary to or like the anticipated material deposition profile of non-uniformity; and using the reconfigured feed electrode, applying the PECVD material layer with a more uniform thickness.

3. A method of making a semiconductor integrated circuit, comprising the steps of:

providing a semiconductor integrated circuit processing wafer including a substrate;

using plasma enhanced chemical vapor deposition (PECVD), forming a first material layer on the substrate, which material layer has a non-uniformity of material thickness over a dimension of the wafer;

determining an anticipated non-uniformity of material thickness over the dimension of the wafer for a second material layer to be formed on the first material layer on the substrate by the PECVD, the anticipated non-uniformity of material thickness is determined based upon the non-uniformity of material thickness of the first material layer on the substrate;

reconfiguring an active feed electrode for the PECVD to complement the anticipated non-uniformity of material thickness; and using the complementarily reconfiguring of the electrode in the PECVD, forming the second material layer, said complementary reconfiguring of the electrode abating the anticipated non-uniformity of material thickness over the dimension of the wafer.

4. A method of making a semiconductor integrated circuit, comprising the steps of:

providing a semiconductor integrated circuit processing wafer including a substrate;

with a plasma, selectively either etching an existing layer of material on the processing wafer or applying a layer of material on the processing wafer;

disposing the processing wafer upon a passive electrode;

providing an active feed electrode which with the passive electrode defines a gap;

disposing the processing wafer in the gap;

determining an anticipated thickness non-uniformity profile of the existing material layer after etching or of the material layer to be applied;

reconfiguring an active surface of the feed electrode to be non-complementary to the passive electrode and to define with the processing wafer a non-uniform spacing selectively complementary to or like the anticipated thickness non-uniformity profile of the existing material layer after etching or of the material layer to be applied; and using the configured electrode, etching the existing material layer by plasma etching or applying the layer of material by plasma enhanced chemical vapor deposition (PECVD) with an improved uniformity of material thickness profile.

5. The method of claim 4 wherein the passive electrode is planar.

* * * * *